(12) United States Patent
Stephenson et al.

(10) Patent No.: US 9,685,306 B2
(45) Date of Patent: Jun. 20, 2017

(54) VENTILATION SYSTEMS FOR USE WITH A PLASMA TREATMENT SYSTEM

(71) Applicant: THE BOEING COMPANY, Huntington Beach, CA (US)

(72) Inventors: Benjamin Jeffrey Stephenson, Seattle, WA (US); Richard Allen Miller, II, Seattle, WA (US); Kieran P. Davis, Tukwila, WA (US); Marcus Anthony Belcher, Sammamish, WA (US)

(73) Assignee: THE BOEING COMPANY, Chicago, IL (US)

( * ) Notice: Subject to any disclaimer, the term of this patent is extended or adjusted under 35 U.S.C. 154(b) by 70 days.

(21) Appl. No.: 14/748,466

(22) Filed: Jun. 24, 2015

(65) Prior Publication Data

US 2016/0379808 A1    Dec. 29, 2016

(51) Int. Cl.
*B01D 49/00* (2006.01)
*B23K 26/142* (2014.01)
*B23K 37/08* (2006.01)
*B08B 15/02* (2006.01)
*H01J 37/32* (2006.01)
*B08B 15/04* (2006.01)

(52) U.S. Cl.
CPC ........ *H01J 37/32834* (2013.01); *B08B 15/04* (2013.01); *H01J 37/32844* (2013.01)

(58) Field of Classification Search
CPC ...... B01D 49/00; B23K 26/142; B23K 9/325; B23K 37/08; B08B 15/002; B08B 15/02; H02H 11/004

USPC .......... 55/385.1, 385, 2, 356, 471, DIG. 18, 55/DIG. 46, 418, 481, 485, 506; 454/63, 454/66, 187
See application file for complete search history.

(56) References Cited

U.S. PATENT DOCUMENTS

| | | | |
|---|---|---|---|
| 5,702,493 A * | 12/1997 | Everetts | B01D 46/0006 454/63 |
| 6,396,214 B1 | 5/2002 | Grosse et al. | |
| 6,616,720 B1 * | 9/2003 | Smith | B08B 15/002 454/187 |
| 8,471,171 B2 | 6/2013 | Price et al. | |
| 9,006,976 B2 | 4/2015 | Watson et al. | |
| 2006/0201118 A1 * | 9/2006 | Dudash | B01D 46/10 55/385.1 |
| 2009/0068375 A1 | 3/2009 | Dobbyn et al. | |
| 2010/0163534 A1 | 7/2010 | Riccardi et al. | |
| 2013/0072861 A1 | 3/2013 | Watson et al. | |
| 2015/0000232 A1 * | 1/2015 | Hammers | B01D 49/00 55/385.1 |

* cited by examiner

*Primary Examiner* — Jacob T Minskey
*Assistant Examiner* — Minh-Chau Pham
(74) *Attorney, Agent, or Firm* — Armstrong Teasdale LLP (57) ABSTRACT

A gas containment apparatus for use with an end effector including at least one plasma head includes at least one enclosing structure coupled to the end effector. The enclosing structure is configured to capture a gas produced by the at least one plasma head. The gas containment apparatus also includes a duct coupled to the at least one enclosing structure and configured to channel the gas from within the enclosing structure.

17 Claims, 6 Drawing Sheets

VENTILATION SYSTEMS FOR USE WITH A PLASMA TREATMENT SYSTEM

BACKGROUND

The present disclosure relates generally to ventilation systems and, more particularly, to ventilation systems and methods used with a plasma treatment system.

Atmospheric pressure plasma treatment systems are used for surface preparation prior to bonding to achieve long-lasting bonding and coating adhesion on various workpieces, such as aircraft composite materials. Plasma treatment activates a surface by selective oxidation processes, reduces or eliminates static charge, and removes microscopic organic particulate from the workpiece surface. The workpiece surface is then prepared to receive an adhesive for bonding or another type of coating, such as paint.

During operation, the plasma treatment system produces potentially harmful gases that require ventilation. At least some known plasma treatment systems are enclosed with a physical barrier to prevent technicians from approaching the system before the gases can dissipate to an acceptable level. Such a solution drastically reduces mobility and restricts the ability of the plasma treatment system to treat highly contoured parts. Additionally, restricting access to the system from the technicians makes preparation and inspection of the system and the workpiece difficult. Other known plasma treatment systems include stationary work stations that include a stationary snorkel ventilation system. Such static snorkel systems are independent of the plasma jet heads and are not suitable for automated, robotic operations.

Accordingly, there is a need for an automated ventilation system that is moveable along with a robotic plasma treatment system and that maintains safety requirements through ventilation of the gases produced during plasma treatment.

BRIEF DESCRIPTION

In one aspect, a gas containment apparatus for use with an end effector including at least one plasma head is provided. The gas containment apparatus includes at least one enclosing structure coupled to the end effector and configured to capture a gas produced by the at least one plasma head. The gas containment apparatus also includes a duct coupled to the at least one enclosing structure and configured to channel the gas from within the enclosing structure.

In another aspect, a ventilation system for use with a plasma treatment system including an end effector having at least one plasma treatment head is provided. The ventilation system includes a gas containment apparatus coupled to the end effector. The gas containment apparatus includes at least one enclosing structure positioned proximate the at least one plasma head and configured to capture a gas produced by the at least one plasma head. The gas containment apparatus also includes a duct coupled to the at least one enclosing structure and configured to channel the gas from within the enclosing structure. The ventilation system also includes a vacuum pump coupled in flow communication with the gas containment apparatus and configured to extract the gas from the at least one enclosing structure through the duct.

In yet another aspect, a method of ventilating a plasma treatment system including an end effector having at least one plasma treatment head is provided. The method includes coupling a gas containment apparatus to the end effector. The coupling step includes positioning at least one enclosing structure of the gas containment apparatus proximate the at least one plasma head such that the at least one enclosing structure capture a gas produced by the at least one plasma head. The coupling step also includes coupling a duct of the gas containment apparatus to the at least one enclosing structure. The method further includes channeling the gas from within the enclosing structure through the duct using a vacuum pump.

DETAILED DESCRIPTION

The implementations described herein include a ventilation system for use in combination with a plasma treatment system. The ventilating system ventilates gases produced during the plasma treatment of a workpiece. The plasma treatment system includes a robotic end effector having at least one plasma head. The ventilation system includes a gas containment apparatus coupled to the end effector. The gas containment apparatus includes at least one enclosing structure having a collar that substantially circumscribes the plasma head and a shroud that captures the gases produced by the plasma head in operation. The gas containment apparatus also includes a duct coupled to the enclosing structure such that the duct is configured to channel the gases from within the shroud to a downstream gas purification system, also known as a scrubber or a scrubbing-device, for processing.

The implementations described herein facilitate mounting the gas containment apparatus directly to the robotic end effector such that the gas containing apparatus moves with the end effector along the workpiece. Accordingly, gases produced by the plasma heads are removed shortly after their production and substantially at the location of production without dispersing into the air surrounding the plasma treatment system. This enables technicians to safely work in close proximity to the plasma treatment system without the need for a barrier that prevents them from accessing the plasma treatment system for inspection or maintenance.

As used herein, an element or step recited in the singular and preceded with the word "a" or "an" should be understood as not excluding plural elements or steps, unless such exclusion is explicitly recited. Furthermore, references to "example implementation" or "one implementation" of the present disclosure are not intended to be interpreted as excluding the existence of additional implementations that also incorporate the recited features.

Figure 1:
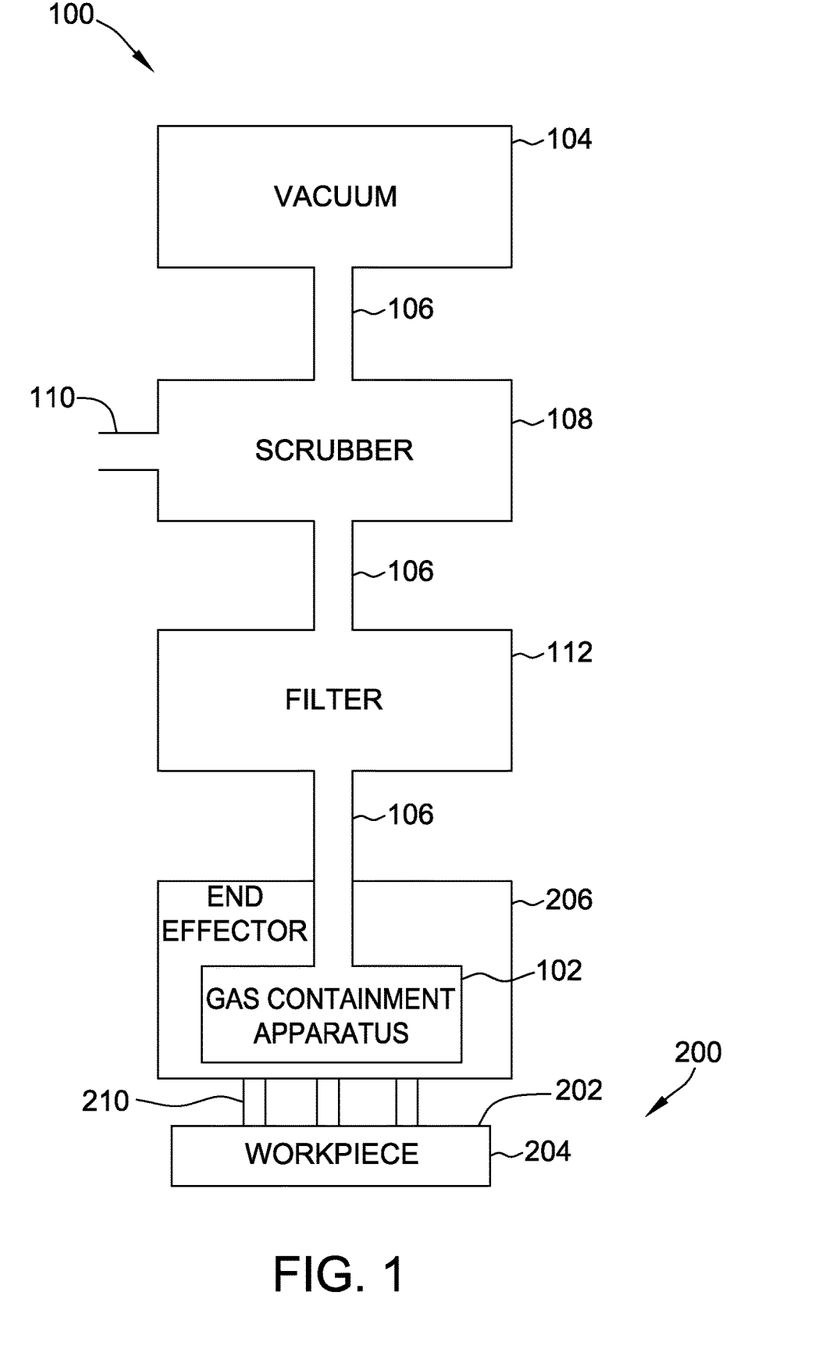
FIG. 1 is a schematic diagram of an exemplary ventilation system.
Figure 2:
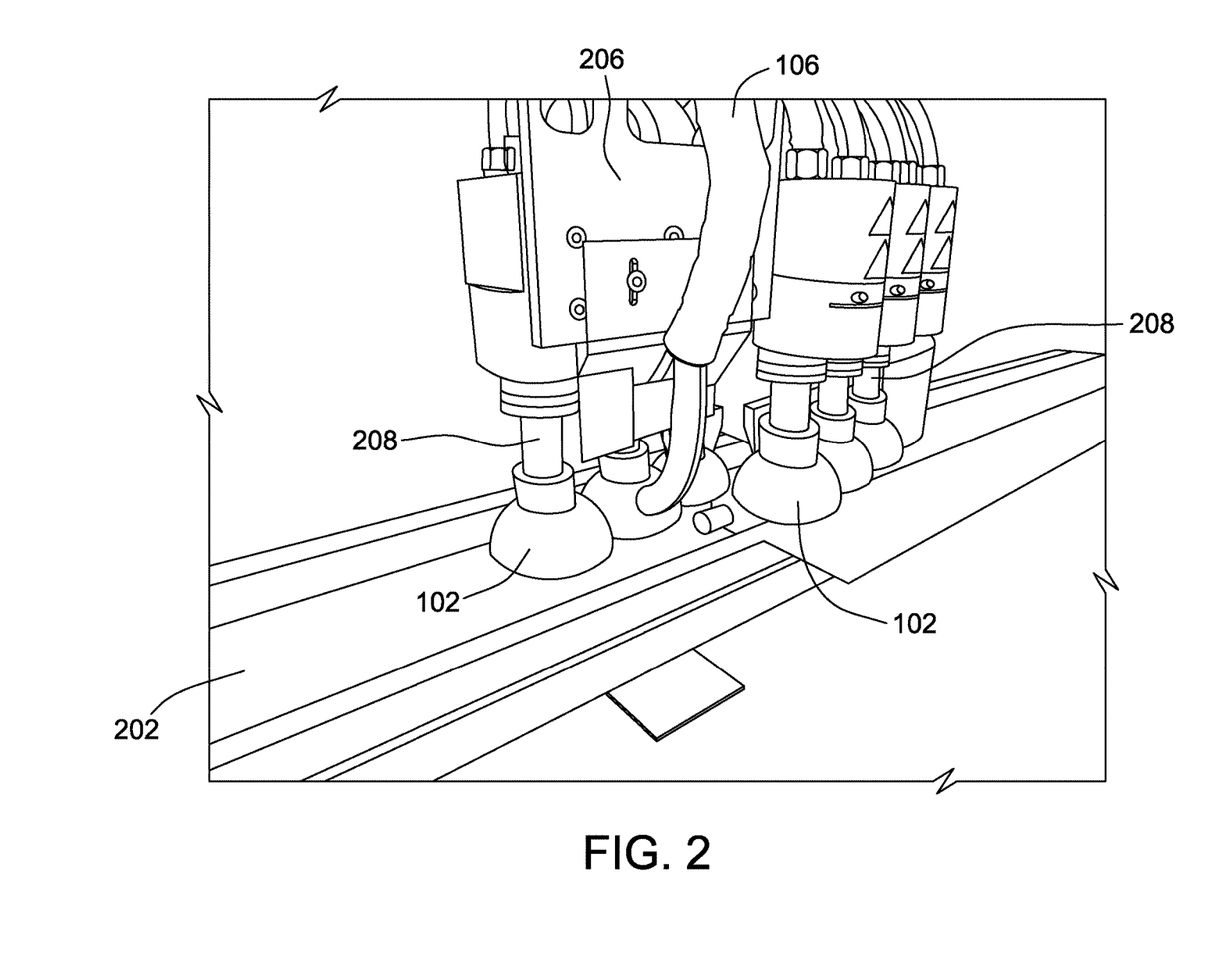
FIG. 2 is a perspective view of the ventilation system shown in FIG. 1.

FIG. 1 is a schematic diagram of an exemplary ventilation system 100, and FIG. 2 is a perspective view of a portion of ventilation system 100 and a plasma treatment system 200. Plasma treatment system 200 is an open-air atmospheric pressure plasma treatment system used to prepare a surface 202 of a workpiece 204 to achieve long-lasting bonding and coating adhesions. In the exemplary implementation, workpiece 204 is a composite material used in the manufacture of aircraft components. Alternatively, workpiece 204 is any material type used in the manufacture of any structure.

In the exemplary implementation, plasma treatment system 200 includes a robotic end effector 206 that includes a plurality of plasma heads 208. Although FIG. 2 illustrates a single end effector 206 having six plasma heads 208, it is contemplated that plasma treatment system 200 may include any number of end effectors having any number of plasma heads. In operation, robotic end effector 206 moves along workpiece 204 and each plasma head 208 directs a thin plasma beam 210 onto workpiece surface 202 to reduce or eliminate static charge and also to minimize or remove microscopic organic particulate from workpiece surface 202. After treatment, workpiece surface 202 is prepared to receive an adhesive for bonding or another type of coating, such as paint. Because end effector 206 is moveable and rotatable about a variety of axes, plasma treatment system 200 can more easily treat contoured and oddly-shaped workpieces than can standard stationary plasma systems. Because the system does not require an enclosed physical barrier, location of the plasma treatment near or adjacent to subsequent processing apparatus is possible.

During treatment, plasma heads 208 produce potentially harmful gases that require ventilation for the safety or nearby technicians. Ventilation system 100 removes the gases from the working area of plasma treatment system 200 and channels them to downstream equipment for processing. More specifically, in the exemplary implementation, ventilation system 100 includes at least one gas containment apparatus 102, also referred to as a snorkel, coupled to end effector 206. Snorkel 102 moves with end effector 206 along workpiece 204 and captures substantially all of the gases produces by plasma heads 208. Ventilation system 100 also includes a vacuum pump 104 coupled in flow communication to snorkel 102 via a flexible hose 106. Vacuum pump 104 applies suction to extract the gases from within snorkel 102 and channel the gases through hose 106 for processing. In the exemplary implementation, ventilation system 100 also includes a scrubbing device 108 coupled in flow communication between vacuum pump 104 and snorkel 102. Scrubbing device 108 receives the gases from hose 106 and process the gases to convert them into safer and healthier alternatives that those produced by plasma heads 208. Once the gases are converted, scrubbing device 108 releases them through a vent 110 into the surrounding environment. Additionally, ventilation system 100 includes a filter 112 coupled in flow communication between scrubbing device 108 and snorkel 102. In the exemplary implementation, filter 112 is a high-efficiency particulate arrestance (HEPA) filter that removes particulate matter, such as fibers, from the gases before the particulate matter reaches scrubbing device 108. Pre-filtering of the gases prior to processing through the scrubbing device ensures reliable operation of the scrubbing device.

In operation, vacuum pump 104 applies suction through hose 106 to remove the gases from snorkel 102. The gases are channeled through filter 112 via vacuum pump 104 such that any particulate matter entrained in the gas flow, such as residue or fibers, is removed from the gas flow. As such, the particulate matter is prevented from continuing onto, and possibly clogging, scrubbing device 108. Scrubbing device 108 then processes the gas flow channeled via hose 108 to remove harmful gas components that are absorbed into a liquid such that only air with acceptable levels of pollutants are released through vent 110 into the atmosphere or channeled into an air recirculating system. Alternatively, any type of gas processing and cleaning device may be used, and scrubbing device 108 is not limited to the liquid based scrubber described herein. Accordingly, ventilation system 100 removes the gases from the work area and enables technicians to safely work in close proximity to plasma treatment system 200.

Figure 3:
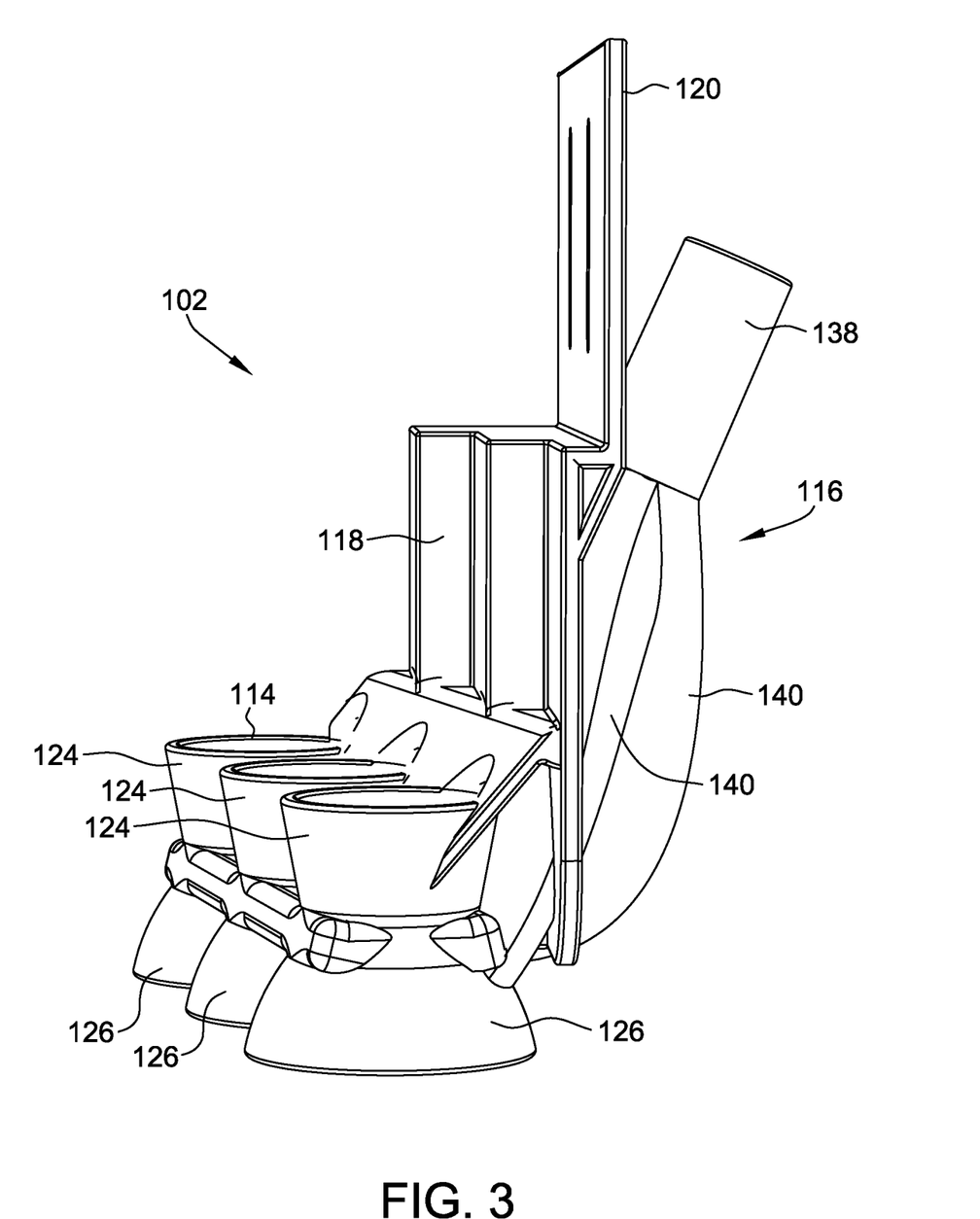
FIG. 3 is a perspective view of an exemplary gas containment apparatus that may be used with the ventilation system shown in FIG. 2.
Figure 4:
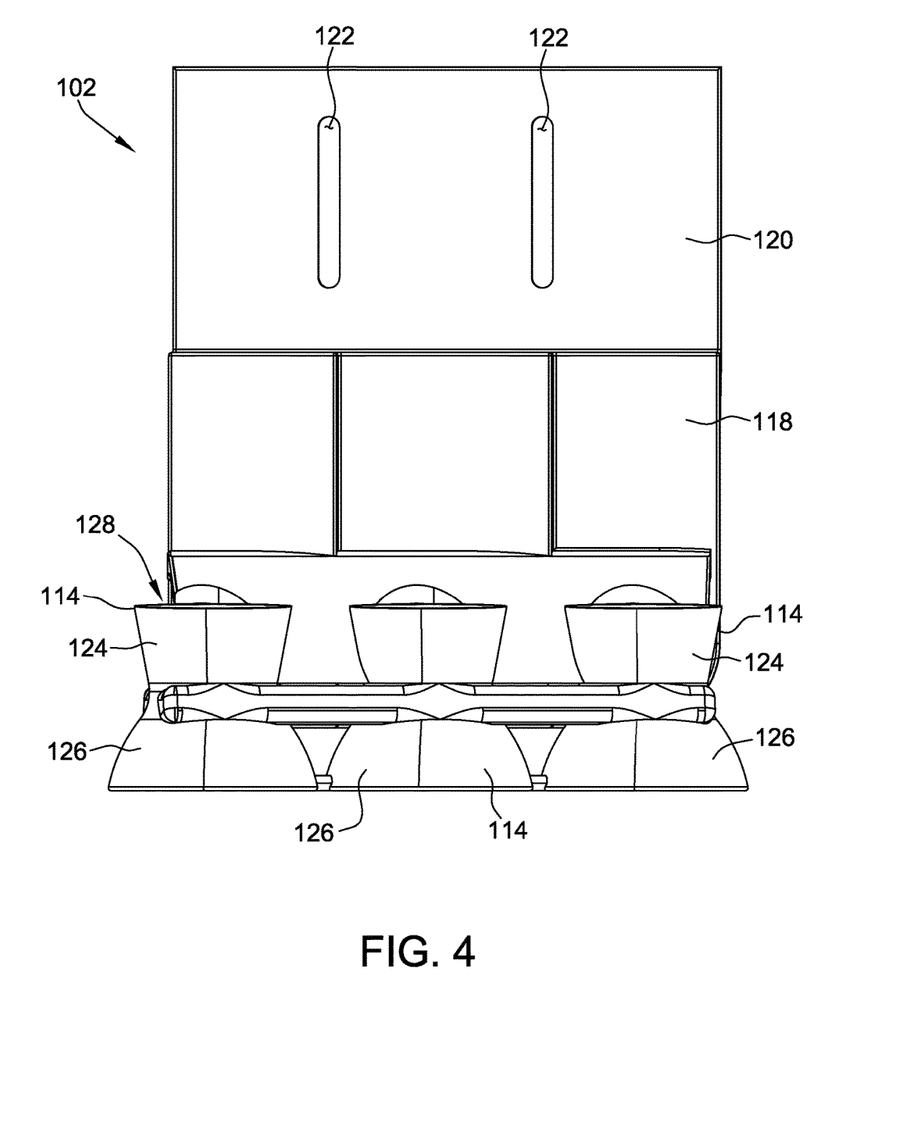
FIG. 4 is a front view of the gas containment apparatus shown in FIG. 3.
Figure 5:
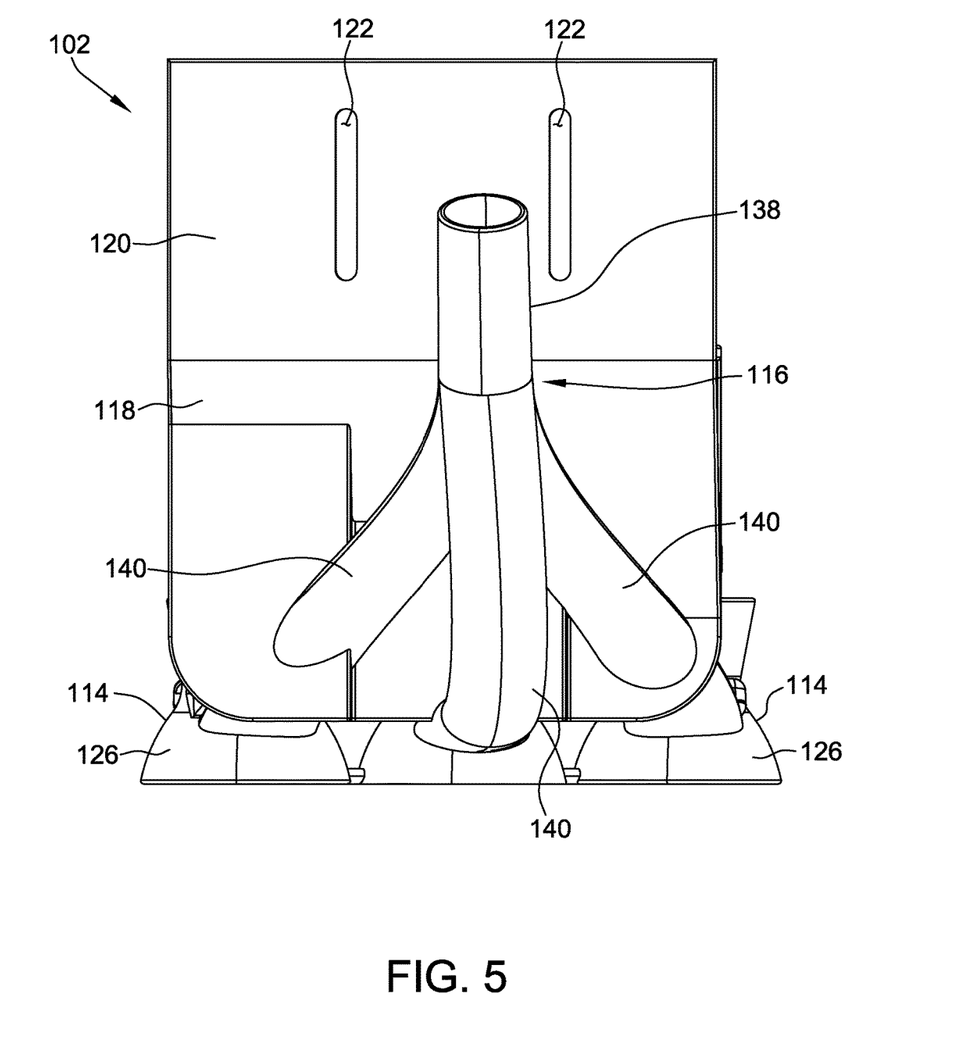
FIG. 5 is a rear view of the gas containment apparatus shown in FIG. 3.
Figure 6:
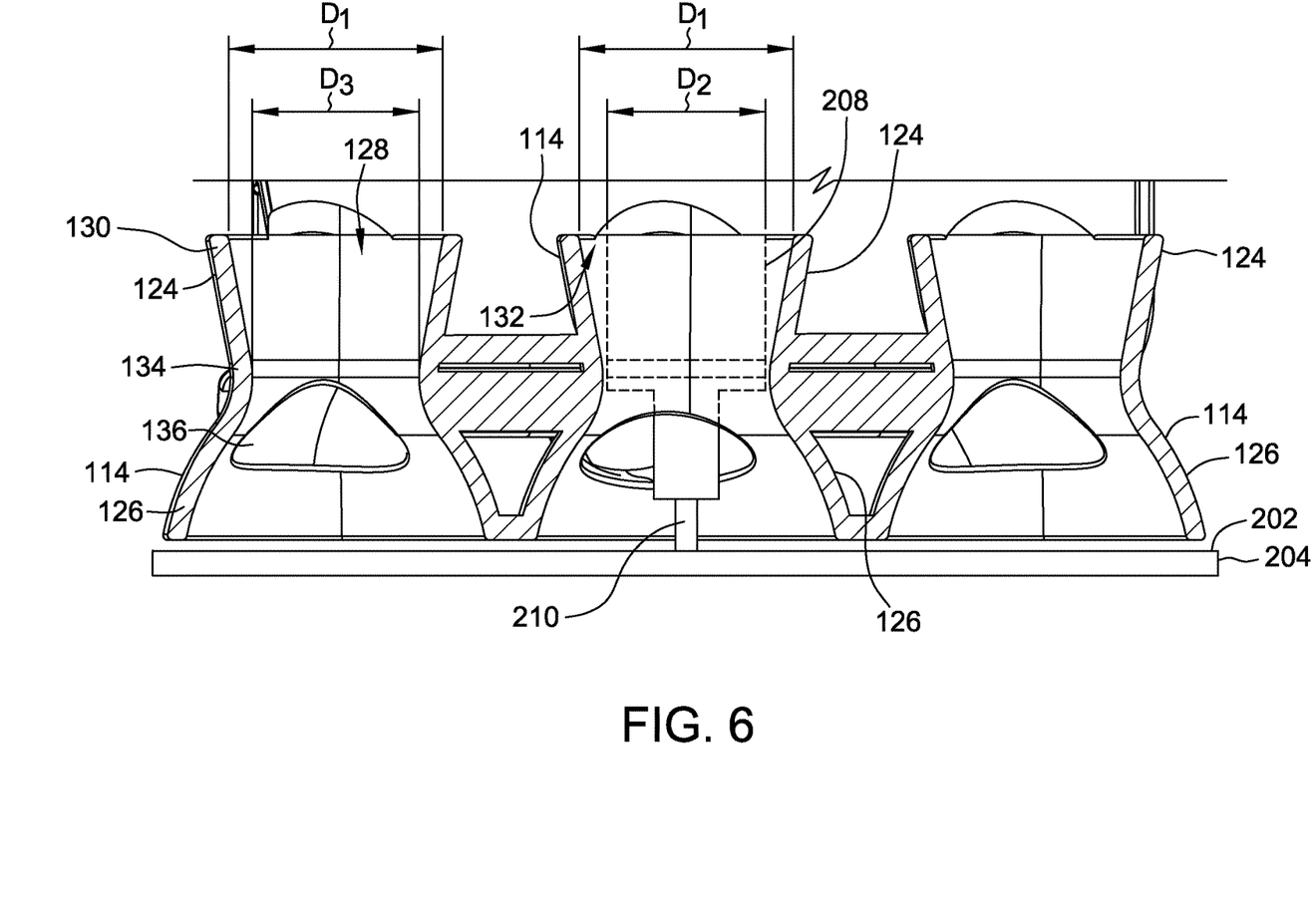
FIG. 6 is a cross-sectional view of the gas containment apparatus shown in FIG. 3.

FIG. 3 is a perspective view of gas containment apparatus, or snorkel 102, that may be used with ventilation system 100 (shown in FIG. 1). FIG. 4 is a front view of snorkel 102, and FIG. 5 is a rear view of snorkel 102. FIG. 6 is a cross-sectional view of snorkel 102 illustrating the arrangement of snorkel 102 and at least one plasma head 208. In the exemplary implementation, snorkel 102 includes at least one enclosing structure 114, a duct 116 coupled to enclosing structure 114, and a support structure 118 coupled between enclosing structure 114 and duct 116. Support structure 118 provides stiffness to snorkel 102 to prevent snorkel 102 from moving relative to the end effector 206 and plasma heads 208.

In the exemplary implementation, snorkel 102 also includes a mounting plate 120 extending from support structure 118. Alternatively, mounting plate 120 extends from enclosing structure 114 and/or duct 116. Mounting plate 120 is coupled to end effector 206 such that mounting plate 120 is coupled between end effector 206 and at least one of enclosing structure 114, duct 116, and support structure 118. More specifically, mounting plate 120 includes at least one opening 122 that receives a fastener (not shown) to coupled snorkel 102 to end effector 206. Alternatively, mounting plate 120 is coupled to end effector 206 in any manner that facilitates operation of snorkel 102 as described herein.

Although FIGS. 3-6 illustrate snorkel 102 having three enclosing structures 114, snorkel 102 may have as many enclosing structures 114 as desired. In the exemplary implementation, each enclosing structure 114 is associated with a respective plasma head 208 such that enclosing structure 114 circumscribes its associated plasma head and captures substantially all of the gasses produced by plasma head 208 during operation. More specifically, enclosing structure 114 includes a collar 124 that circumscribes plasma head 208 and a shroud 126 that captures the produces gases. In the exemplary implementation, each plasma head 208 is associated with a separate enclosing structure 114 such that the gases produced by each plasma head 208 are captured by a separate shroud 126. Alternatively, enclosing structure 114 includes a common shroud that captures the gases produced by more than one plasma head 208.

Referring now to FIG. 6, enclosing structure 114, and more specifically collar 124, includes a first opening 128 at a collar first end 130 that receives plasma head 208 therein. Collar first end opening 128 defines a first diameter D1 that is larger than a second diameter D2 of plasma head 208 such that a gap 132 is defined between plasma head 208 and collar 124. Furthermore, collar 124 includes a second end 134 defines a third diameter D3 that is also smaller than first diameter D1 of collar first end 130. Accordingly, collar 124 narrows from first end 130 to second end 134. The tapered shape of collar 124 enables a technician to more easily insert plasma heads 208 into enclosing structures 114 when affixing snorkel 102 to end effector 206. Additionally, second diameter D2 of plasma head 208 is smaller than third diameter D3 of collar second end 134 such that plasma head 208 does not contact any portion of enclosing structure 114. In operation, plasma head 208 rotates at a relatively high rate of speed and so it is desirable to prevent contact of plasma head 208 and snorkel 102. Additionally, plasma beam 210 reaches a temperature of approximately 200 degrees Fahrenheit. As such, snorkel 102 is manufactured from a stiff material that can withstand the operating temperatures without deforming and that prevents movement of snorkel relative to end effector 206 and, thus, ensures that enclosing structure 114 does not contact plasma head 208. More specifically, in the exemplary implementation, snorkel 102 is fabricated using an additive manufacturing process such that enclosing structure 114, duct 116, support structure 118, and mounting plate 120 are integrally formed. Alternatively, enclosing structure 114, duct 116, support structure 118, and mounting plate 120 are separate component that are coupled together to form snorkel.

In the exemplary implementation, each shroud 126 is substantially dome-shaped such that shroud 126 surrounds the interaction of plasma beam 210 and workpiece 204 and is able to capture the gasses produced by beam 210. Alternatively, shroud 126 is any shape that facilitates operation of enclosing structure 114 as described herein. Further, in the exemplary implementation, shroud 126 includes an opening 136 coupled in flow communication with duct 116 such that duct 116 channels the gases from within shroud 126. Alternatively, in implementations having a single shroud for multiple plasma heads 208, the common shroud may include an opening proximate each plasma head 208 or may include only a single opening. In the exemplary implementation, shroud 126 includes a length that positions a distal end of shroud 126 in close proximity to surface 202 of workpiece 200. Generally, the distal end is positioned as close to surface 202 as possible without making contact to ensure capture of as much of the gases as possible.

As best shown in FIG. 5, duct 116 includes a common duct portion 138 and a plurality of duct branches 140. In the exemplary implementation, common duct portion 138 is coupled to hose 106 and duct 116 includes one branch 140 for each enclosing structure 114 such that each branch 140 is coupled to a respective shroud 126. In implementations of enclosing structure 114 having a single shroud for multiple plasma heads 208, duct 116 includes as many branches 140 as there are openings in the common shroud. Each branch 140 includes a predetermine length and diameter such that the amount of suction provided by vacuum pump 104 is split substantially equally among branches 140.

The implementations described herein include a ventilation system for use in combination with a plasma treatment system. The ventilating system ventilates gases produced during the plasma treatment of a workpiece. The plasma treatment system includes a robotic end effector having at least one plasma head. The ventilation system includes a gas containment apparatus coupled to the end effector. The gas containment apparatus includes at least one enclosing structure having a collar that substantially circumscribes the plasma head and a shroud that captures the gases produced by the plasma head in operation. The gas containment apparatus also includes a duct coupled to the enclosing structure such that the duct is configured to channel the gases from within the shroud to a downstream scrubbing device for processing.

The implementations described herein facilitate mounting the gas containment apparatus directly to the robotic end effector such that the gas containing apparatus moves with the end effector along the workpiece. Accordingly, gases produced by the plasma heads are removed shortly after their production and substantially at the location of production without dispersing into the air surrounding the plasma treatment system. This enables technicians to safely work in close proximity to the plasma treatment system without the need for a barrier that prevents them from accessing the plasma treatment system for inspection or maintenance.

Although specific features of various examples of the invention may be shown in some drawings and not in others, this is for convenience only. In accordance with the principles of the invention, any feature of a drawing may be referenced and/or claimed in combination with any feature of any other drawing.

This written description uses examples to disclose various examples, which include the best mode, to enable any person skilled in the art to practice those examples, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A gas containment apparatus for use with an end effector including at least one plasma head, said gas containment apparatus comprising:
   at least one enclosing structure coupled to the end effector, wherein said at least one enclosing structure comprises:
      a collar configured to circumscribe the plasma head, wherein said collar defines a cavity configured to receive the at least one plasma head therein; and
      a shroud coupled to said collar, said shroud configured to capture a gas produced by the at least one plasma head; and
   a duct coupled to said at least one enclosing structure, said duct configured to channel the gas from within said enclosing structure.

2. The gas containment apparatus in accordance with claim 1 wherein said collar includes a first end defining a first diameter and a second end defining a second diameter smaller than the first diameter.

3. The gas containment apparatus in accordance with claim 1 wherein said duct is coupled to said shroud.

4. The gas containment apparatus in accordance with claim 1 further comprising a support structure coupled between said at least one enclosing structure and said duct.

5. The gas containment apparatus in accordance with claim 4 further comprising a mounting plate coupled between the end effector and at least one of said duct, said at least one enclosing structure, and said support structure.

6. The gas containment apparatus in accordance with claim 1, wherein said at least one enclosing structure and said duct are integrally formed by additive manufacturing.

7. The gas containment apparatus in accordance with claim 1, wherein said at least one enclosing structure comprises a plurality of enclosing structures.

8. The gas containment apparatus in accordance with claim 7, wherein said duct comprises a common duct portion and a plurality of branches, wherein each said branch extends between said common duct portion and a respective enclosing structure.

9. A ventilation system for use with a plasma treatment system including an end effector having at least one plasma treatment head, said ventilation system comprising:
   a gas containment apparatus coupled to the end effector, said gas containment apparatus comprising:
      at least one enclosing structure positioned proximate the at least one plasma head, said at least one enclosing structure comprising:

a collar configured to circumscribe the plasma head, wherein said collar defines a cavity configured to receive the at least one plasma head therein; and a shroud coupled to said collar, said shroud configured to capture a gas produced by the at least one plasma head; and a duct coupled to said at least one enclosing structure, said duct configured to channel the gas from within said enclosing structure; and a vacuum pump coupled in flow communication with said gas containment apparatus, said vacuum pump configured to extract the gas from the at least one enclosing structure through said duct.

10. The ventilation system in accordance with claim 9 further comprising a gas cleaning device coupled in flow communication between said vacuum pump and said gas containment apparatus, said gas cleaning device configured to process the gas from said enclosing structure.

11. The ventilation system in accordance with claim 10 further comprising a filter in flow communication between said gas cleaning device and said gas containment apparatus, said filter configured to remove particulate matter entrained in the gas.

12. The ventilation system in accordance with claim 9 further comprising a filter in flow communication between said vacuum pump and said gas containment apparatus, said filter configured to remove particulate matter entrained in the gas.

13. The ventilation system in accordance with claim 9, wherein said duct is coupled to said shroud.

14. The ventilation system in accordance with claim 9, wherein said at least one enclosing structure comprises a plurality of enclosing structures, and wherein said duct comprises a common duct portion and a plurality of branches, wherein each said branch extends between said common duct portion and a respective enclosing structure.

15. A method of ventilating a plasma treatment system including an end effector having at least one plasma treatment head, said method comprising:

coupling a gas containment apparatus to the end effector;
wherein coupling a gas containment apparatus comprises positioning at least one enclosing structure of the gas containment apparatus proximate the at least one plasma head such that a cavity defined by a collar of the at least one enclosing structure circumscribes the plasma head and is configured to receive the at least one plasma head therein, wherein the at least one enclosing structure captures a gas produced by the at least one plasma head; and wherein coupling a gas containment apparatus comprises coupling a duct of the gas containment apparatus to the at least one enclosing structure; and channeling the gas from within the enclosing structure through the duct using a vacuum pump.

16. The method of claim 15, wherein positioning the at least one enclosing structure proximate the at least one plasma head comprises positioning a shroud of at least one enclosing structure, and coupled to the collar, about the at least one plasma head such that the shroud captures the gas produced by the at least one plasma head.

17. The method of claim 15, further comprising:

channeling the gas through a filter to remove particulate matter from the gas; and channeling the gas through a gas cleaning device to treat the gas.

* * * * *